United States Patent
Itoh

(10) Patent No.: US 9,318,525 B2
(45) Date of Patent: Apr. 19, 2016

(54) METHOD FOR MANUFACTURING SOLID-STATE IMAGE SENSOR

(71) Applicant: CANON KABUSHIKI KAISHA, Tokyo (JP)

(72) Inventor: Hideyuki Itoh, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/449,299

(22) Filed: Aug. 1, 2014

(65) Prior Publication Data

US 2015/0064827 A1   Mar. 5, 2015

(30) Foreign Application Priority Data

Sep. 3, 2013   (JP) ................................. 2013-182474

(51) Int. Cl.

| H01L 27/148 | (2006.01) |
|---|---|
| H01L 31/18 | (2006.01) |
| H04N 5/335 | (2011.01) |
| H04N 5/225 | (2006.01) |
| H01L 27/146 | (2006.01) |

(52) U.S. Cl.
CPC ...... *H01L 27/14689* (2013.01); *H01L 27/1463* (2013.01); *H01L 27/14627* (2013.01); *H01L 27/14645* (2013.01)

(58) Field of Classification Search
CPC .............. H01L 27/14609; H01L 27/14616; H01L 27/14621; H01L 27/14625; H01L 27/14643; H01L 27/14645; H01L 27/14647; H01L 27/148; H01L 27/14831; H04N 5/335; H04N 5/35563; H04N 9/045

See application file for complete search history.

(56) References Cited

U.S. PATENT DOCUMENTS

| 7,911,521 B2 | 3/2011 | Kuroda et al. | |
|---|---|---|---|
| 8,390,713 B2 | 3/2013 | Kuroda et al. | |
| 2009/0045407 A1* | 2/2009 | Nagasaki et al. | ............... 257/72 |
| 2013/0076934 A1* | 3/2013 | Maeda | ....................... 348/222.1 |
| 2013/0140608 A1 | 6/2013 | Kuroda et al. | |

FOREIGN PATENT DOCUMENTS

| JP | 2007-201267 A | 8/2007 |
|---|---|---|
| JP | 2008-270299 A | 11/2008 |

* cited by examiner

*Primary Examiner* — Mary Wilczewski
*Assistant Examiner* — Pamela E Perkins
(74) *Attorney, Agent, or Firm* — Fitzpatrick, Cella, Harper & Scinto

(57) ABSTRACT

A first pixel includes a first charge accumulation portion of a first conductivity type in a first region. A second pixel includes a second charge accumulation portion of the first conductivity type in a second region and a semiconductor region of a second conductivity type in a third region. Impurities of the second conductivity type are doped in the third region and the impurities of the second conductivity type are doped in at least the second region to generate a first difference between quantities of doping the impurities of the second conductivity type in the first and second regions. Impurities are doped in the first and second regions to reduce a second difference, caused by the first difference, between net quantities of doping impurities of the first conductivity type in the first and second regions.

19 Claims, 8 Drawing Sheets

METHOD FOR MANUFACTURING SOLID-STATE IMAGE SENSOR

BACKGROUND OF THE INVENTION

1. Field of the Invention

The present invention relates to a method for manufacturing a solid-state image sensor.

2. Description of the Related Art

Japanese Patent Laid-Open No. 2007-201267 discloses a pixel structure in which the depth of a semiconductor layer constituting a photodiode changes depending on the color. According to Japanese Patent Laid-Open No. 2007-201267, this arrangement can effectively reduce a dark current and suppress generation of a white spot without adversely affecting an accumulated charge clear operation by an overflow drain. Japanese Patent Laid-Open No. 2008-270299 discloses an arrangement in which a contact plug for fixing the potential of a well is arranged in only some of a plurality of pixels.

In the arrangements described in Japanese Patent Laid-Open Nos. 2007-201267 and 2008-270299, the saturated charge quantity may differ between pixels having different structures. This is because the net quantity (difference between the quantity of doping of a donor and the quantity of doping of an acceptor) of doping impurities in a region constituting a charge accumulation portion differs between pixels having different structures. More specifically, in the arrangement described in Japanese Patent Laid-Open No. 2007-201267, the saturated charge quantity is smaller for a pixel in which the depth of a semiconductor layer constituting a photodiode is shallow. In the arrangement described in Japanese Patent Laid-Open No. 2008-270299, the saturated charge quantity of a charge accumulation portion arranged near a region in which a contact plug is connected is smaller than that of the remaining charge accumulation portions. This is because the formation of a well contact region in which the contact plug is connected influences the impurity density distribution of the charge accumulation portion.

If a pixel having a large saturated charge quantity and a pixel having a small saturated charge quantity exist in a pixel array, charges may move to an adjacent pixel when, for example, a pixel with a small saturated charge quantity reaches the saturated charge quantity at a high illuminance. This generates a color mixture, impairing the color reproducibility.

The present invention provides a technique advantageous to reduce a difference in saturated charge quantity between pixels.

SUMMARY OF THE INVENTION

One of aspects of the present invention provides a method for manufacturing a solid-state image sensor including a first pixel and a second pixel in a semiconductor substrate, the first pixel including a first charge accumulation portion of a first conductivity type in a first region, and the second pixel including a second charge accumulation portion of the first conductivity type in a second region, and a semiconductor region of a second conductivity type in a third region, the second conductivity type being different from the first conductivity type, the method comprising the steps of: forming the first charge accumulation portion and the second charge accumulation portion; and forming the semiconductor region, wherein in the step of forming the semiconductor region, impurities of the second conductivity type are doped in the third region, and the impurities of the second conductivity type are doped in at least the second region to generate a first difference between a quantity of doping the impurities of the second conductivity type in the first region, and a quantity of doping the impurities of the second conductivity type in the second region, and in the step of forming the first charge accumulation portion and the second charge accumulation portion, impurities are doped in the first region and the second region to reduce a second difference, caused by the first difference, between a net quantity of doping impurities of the first conductivity type in the first region, and a net quantity of doping the impurities of the first conductivity type in the second region.

Further features of the present invention will become apparent from the following description of exemplary embodiments with reference to the attached drawings.

DESCRIPTION OF THE EMBODIMENTS

The present invention will now be described throughout exemplary embodiments of the present invention with reference to the accompanying drawings.

Figure 1A:
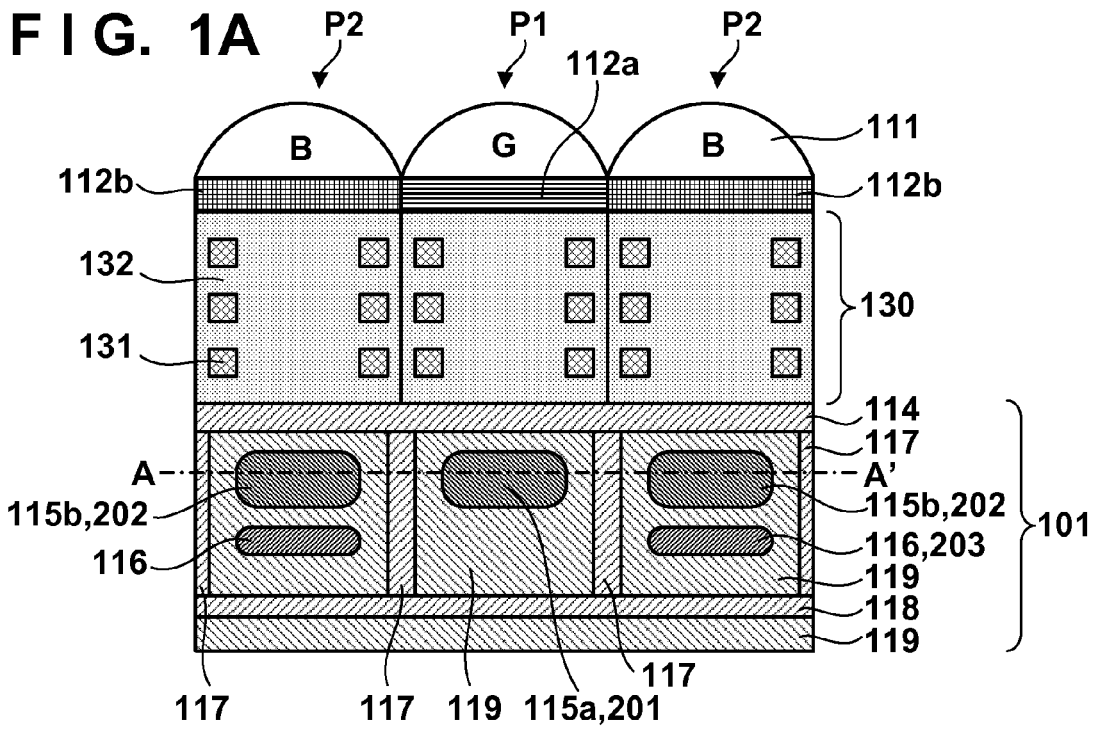
FIGS. 1A and 1B are views showing the arrangement of a solid-state image sensor according to the first embodiment.
Figure 1B:
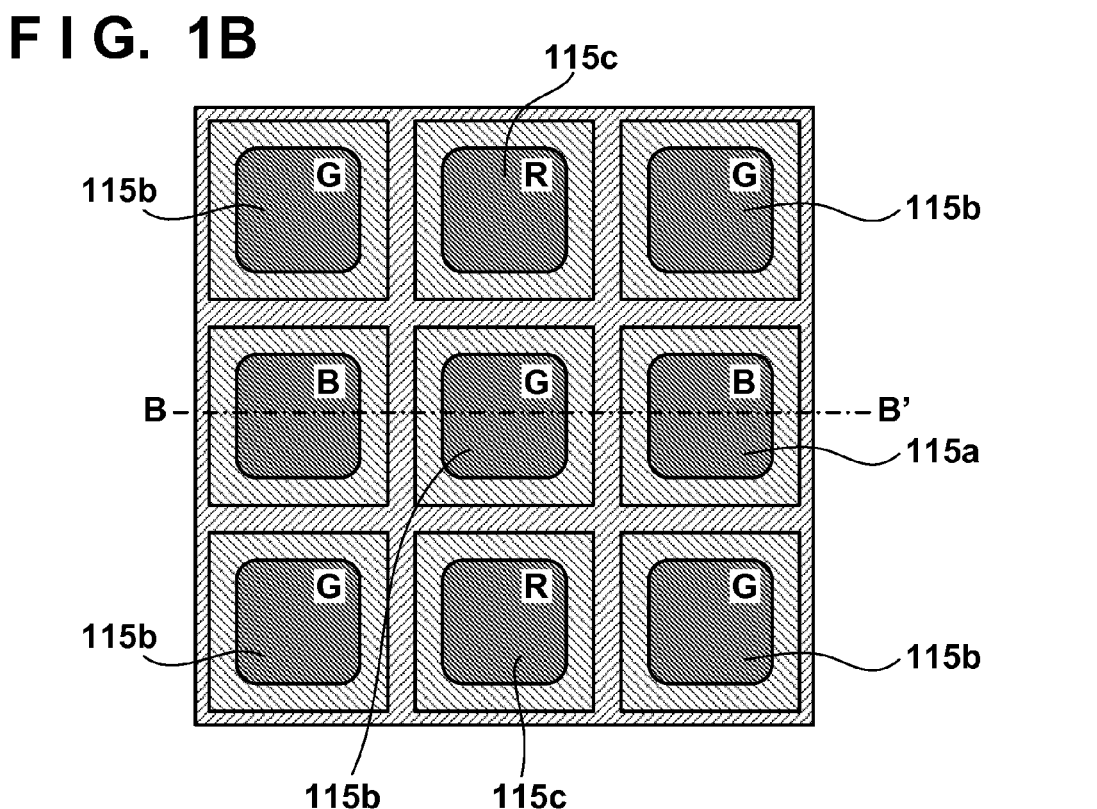

FIGS. 1A and 1B show a solid-state image sensor according to the first embodiment of the present invention. FIG. 1A is a sectional view showing part of the pixel array of the solid-state image sensor taken along a plane perpendicular to the image sensing surface. FIG. 1B is a sectional view showing part of the pixel array of the solid-state image sensor taken along a plane parallel to the image sensing surface. FIG. 1A is a sectional view taken along a line B-B' in FIG. 1B. FIG. 1B is a sectional view taken along a line A-A' in FIG. 1A.

In the pixel array of the solid-state image sensor, R pixels configured to receive a light in the red range, G pixels configured to receive a light in the green range, and B pixels configured to receive a light in the blue range are arrayed in accordance with a predetermined array such as a Bayer array. Each R pixel includes a color filter (not shown) which transmits a light in the red range. Each G pixel includes a color filter 112$b$ which transmits a light in the green range. Each B pixel includes a color filter 112$a$ which transmits a light in the blue range. In FIGS. 1A and 1B, "R" stands for an R pixel, "G" stands for a G pixel, and "B" stands for a "B" pixel.

In the embodiment, R and G pixels have the same structure, and the structure of R and G pixels is different from that of B pixels. To discriminate pixels having different structures, R and G pixels will be called first pixels P1, and B pixels will be called second pixels P2. However, the first and second pixels are merely an expression for discriminating pixels having different structures. For example, B and G pixels may have the same structure, and the structure of B and G pixels may be different from that of R pixels. In this case, R pixels can be called the first pixels, and B and G pixels can be called the second pixels. Alternatively, all B, G, and R pixels may have different structures. In this case, G pixels and/or R pixels can be called the first pixels, and B pixels can be called the second pixels. The first pixel is a pixel configured to receive a light in the first wavelength range. The second pixel is a pixel configured to receive a light in the second wavelength range in which the central wavelength is shorter than that in the first wavelength range.

The solid-state image sensor includes a semiconductor substrate 101, a wiring structure 130 arranged on the semiconductor substrate 101, the color filters 112a and 112b arranged on the wiring structure 130, and microlenses 111 arranged on the color filters 112a and 112b. The semiconductor substrate 101 can be constructed by a silicon substrate. The wiring structure 130 includes a wiring pattern 131 and interlayer insulation film 132.

The semiconductor substrate 101 can include charge accumulation portions 115a, 115b, and 115c of the first conductivity type, and a buried layer 118 of the second conductivity type that is arranged at a position deeper than the charge accumulation portions 115a, 115b, and 115c of the first conductivity type in the semiconductor substrate 101. The semiconductor substrate 101 can further include a surface region 114 of the second conductivity type that is arranged at a position shallower than the charge accumulation portions 115a, 115b, and 115c of the first conductivity type in the semiconductor substrate 101. The charge accumulation portions 115a, 115b, and 115c of the first conductivity type are arranged in semiconductor regions 119 of the first conductivity type, and are larger in the net quantity of doping impurities of the first conductivity type than the semiconductor regions 119. The surface region 114 includes the buried charge accumulation portions 115a, 115b, and 115c, and prevents accumulation of a noise component generated by a dark current at the charge accumulation portions 115a, 115b, and 115c. The semiconductor substrate 101 can include a semiconductor region 116 of the second conductivity type between the charge accumulation portion 115b and the buried layer 118 and near the charge accumulation portion 115b. The charge accumulation portions 115a, 115b, and 115c of the first conductivity type are isolated from each other by isolation regions 117 of the second conductivity type.

The first and second conductivity types are different from each other. When the first conductivity type is an n type, the second conductivity type is a p type. When the first conductivity type is a p type, the second conductivity type is an n type. Impurities of the first conductivity type are impurities for forming a semiconductor region doped with them into a semiconductor region of the first conductivity type. Impurities of the second conductivity type are impurities for forming a semiconductor region doped with them into a semiconductor region of the second conductivity type. Examples of the impurities for forming a semiconductor region into an n-type semiconductor region are phosphorus and arsenic. Examples of the impurities for forming a semiconductor region into a p-type semiconductor region are boron and indium. The net quantity of doping impurities of the first conductivity type is obtained by subtracting the quantity of doping impurities of the second conductivity type from the quantity of doping the impurities of the first conductivity type.

The arrangement of R, G, and B pixels will be explained here. In this example, the G pixel serving as the first pixel P1 includes the first charge accumulation portion 115a of the first conductivity type arranged in a first region 201. In this example, the R pixel serving as the other first pixel includes the first charge accumulation portion 115c of the first conductivity type arranged in the first region 201. In this example, the B pixel serving as the second pixel P2 includes the second charge accumulation portion 115b of the first conductivity type arranged in a second region 202, and the semiconductor region 116 of the second conductivity type in a third region 203 positioned between the charge accumulation portion 115b and the buried layer 118 and near the second region 202. The semiconductor region 116 forms a potential barrier which prevents entrance of charges exceeding the isolation regions 117 from the G and R pixel adjacent to the B pixel.

The charge accumulation portion 115a of the first conductivity type, the semiconductor region 119 of the first conductivity type, the surface region 114 of the second conductivity type, and the buried layer 118 of the second conductivity type constitute the photoelectric converter of the G pixel. The charge accumulation portion 115c of the first conductivity type, the semiconductor region 119 of the first conductivity type, the surface region 114 of the second conductivity type, and the buried layer 118 of the second conductivity type constitute the photoelectric converter of the R pixel. The charge accumulation portion 115b of the first conductivity type, the semiconductor region 119 of the first conductivity type, the surface region 114 of the second conductivity type, and the buried layer 118 of the second conductivity type constitute the photoelectric converter of the B pixel.

A light having a shorter wavelength is more easily absorbed by the semiconductor substrate 101. Hence, a blue light in a short wavelength range is absorbed by the semiconductor substrate 101 at a portion near the surface of the semiconductor substrate 101. That is, the blue light is photoelectrically converted at a portion near the surface of the semiconductor substrate 101. To the contrary, for a red light and green light in long wavelength ranges, particularly, the red light reaches a deep position from the surface of the semiconductor substrate 101. That is, the red light and green light are photoelectrically converted at deep positions from the surface of the semiconductor substrate 101. Charges generated by photoelectric conversion at a deep position from the surface of the semiconductor substrate 101 can enter the adjacent B pixel. As described above, in the B pixel, the semiconductor region 116 of the second conductivity type is interposed between the charge accumulation portion 115b and the buried layer 118, and forms a potential barrier.

When impurities of the second conductivity type are doped in the third region 203 of the B pixel serving as the second pixel P2 in order to form the semiconductor region 116 of the second conductivity type, they are also doped in the second region 202 of the B pixel. A difference is therefore generated between the quantity of doping the impurities of the second conductivity type in the first regions 201 of the G and R pixels serving as the first pixels P1, and the quantity of doping the impurities of the second conductivity type in the second region 202 of the B pixel serving as the second pixel P2. For example, the impurities of the second conductivity type are not doped in the first regions 201 of the G and R pixels, but are doped in the second region 202 of the B pixel. As a result, a difference is generated between the quantity of doping the impurities of the second conductivity type in the first region 201, and the quantity of doping the impurities of the second conductivity type in the second region 202. Alternatively, the impurities of the second conductivity type of the first quantity are doped in the first regions 201 of the G and R pixels, and the impurities of the second conductivity type of the second quantity larger than the first quantity are doped in the second region 202 of the B pixel. As a consequence, a difference is generated between the quantity of doping the impurities of the second conductivity type in the first region 201, and the quantity of doping the impurities of the second conductivity type in the second region 202. If the charge accumulation portions 115a, 115b, and 115c are formed without considering this difference, a difference can be generated between the net quantity of doping impurities of the first conductivity type in the first region 201, and the net quantity of doping the impurities of the first conductivity type in the second region 202. Accordingly, a difference is generated between the saturated charge quantities of the charge accumulation portion 115a of the G pixel and the charge accumulation portion 115c of the R pixel, and the saturated charge quantity of the charge accumulation portion 115b of the B pixel. This degrades the image quality. Hence, in the first embodiment, impurities are doped in the first region 201 and second region 202 to reduce the difference between the net quantity of doping impurities of the first conductivity type in the first region 201, and the net quantity of doping impurities of the first conductivity type in the second region 202.

A method for manufacturing the solid-state image sensor according to the first embodiment of the present invention will be explained. This manufacturing method includes a step of forming the charge accumulation portions 115a and 115c of the first pixels P1, and the charge accumulation portion 115b of the second pixel P2, and a step of forming the semiconductor region 116.

Figure 2A:
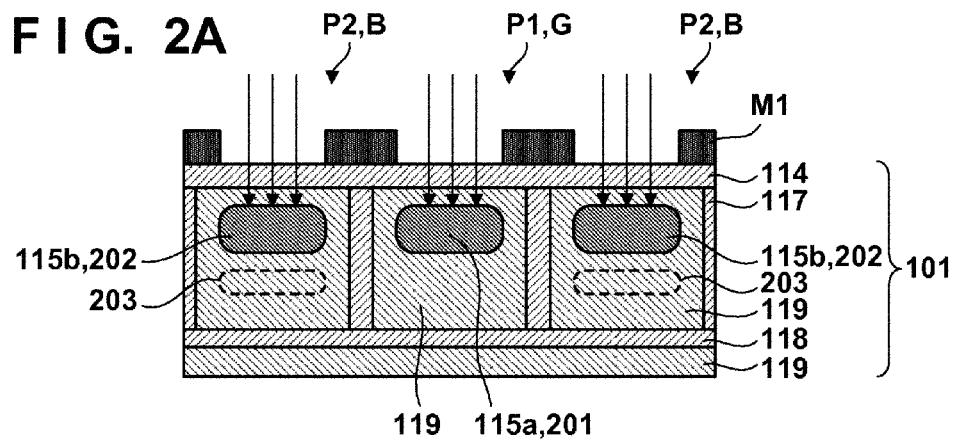
FIGS. 2A to 2C are sectional views showing an example of a method for manufacturing the solid-state image sensor according to the first embodiment.
Figure 2B:
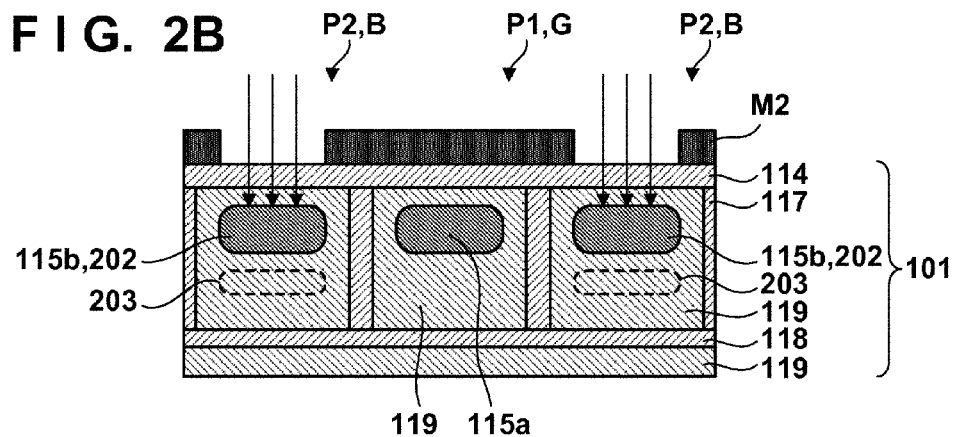
Figure 2C:
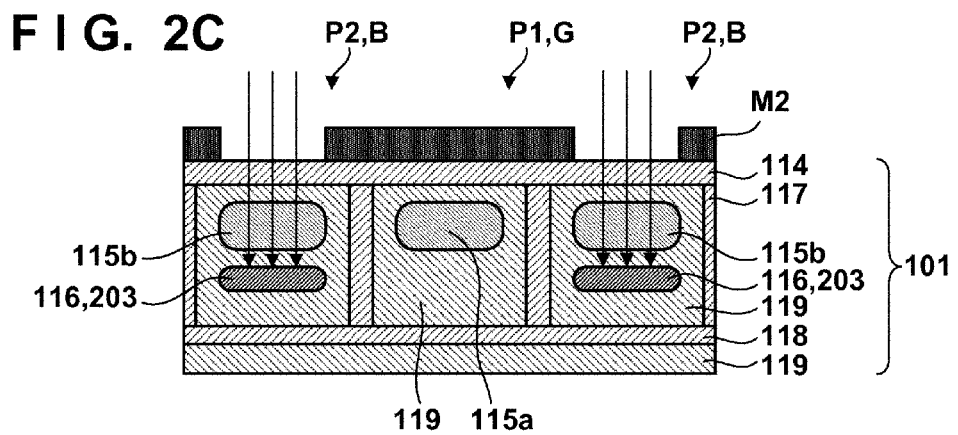
Figure 3A:
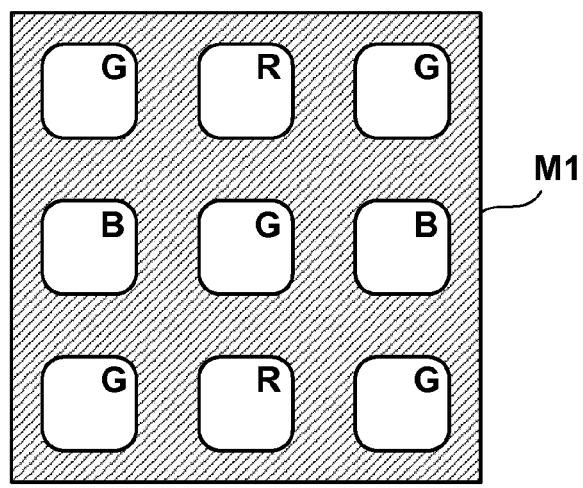
FIGS. 3A to 3C are plan views showing a mask formed in the manufacture of the solid-state image sensor according to the first embodiment.

FIGS. 2A to 2C show an example of the method for manufacturing the solid-state image sensor according to the first embodiment of the present invention. Steps shown in FIGS. 2A to 2C can be practiced in an arbitrary order. The steps shown in FIGS. 2A and 2B are steps of forming the charge accumulation portion 115a of a G pixel, the charge accumulation portion 115c of an R pixel, and the second charge accumulation portion 115b of a B pixel. In the step shown in FIG. 2A, a mask M1 is formed on a semiconductor substrate 101, and impurities of the first conductivity type are doped simultaneously in first regions 201 of the G and R pixels and a second region 202 of the B pixel through the openings of the mask M1. As a result, first charge accumulation portions 115a and 115c, and a second charge accumulation portion 115b are formed. FIG. 3A is a plan view showing the mask M1. The mask M1 can be formed by photolithography.

Figure 3B:
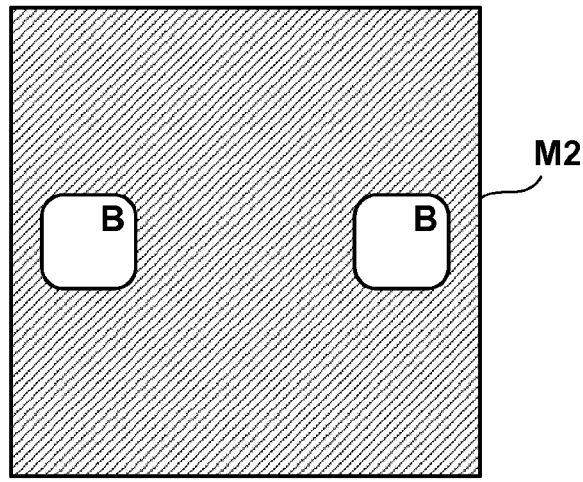

In the step shown in FIG. 2B, impurities of the first conductivity type are doped in the second region 202 of the B pixel serving as a second pixel P2 in which impurities of the second conductivity type are doped in a third region 203 in the step shown in FIG. 2C. More specifically, a mask M2 is formed on the semiconductor substrate 101, and the impurities of the first conductivity type are doped in the second region 202 of the B pixel serving as the second pixel P2 through the opening of the mask M2. The mask M2 is arranged so that, in this step, the impurities of the first conductivity type are not doped in the first regions 201 of the G and R pixels serving as the first pixels P1. FIG. 3B is a plan view showing the mask M2. The mask M2 can be formed by photolithography.

In the step shown in FIG. 2C, a semiconductor region 116 is formed. In the step shown in FIG. 2C, a mask M2 is formed on the semiconductor substrate 101, and impurities of the second conductivity type are doped in the third region 203 of the B pixel serving as the second pixel P2 through the opening of the mask M2, thereby forming the semiconductor region 116. The mask M2 is arranged so that, in this step, the impurities of the second conductivity type are not doped in the first regions 201 of the G and R pixels serving as the first pixels P1. The mask M2 used in the step shown in FIG. 2B, and the mask M2 used in the step shown in FIG. 2C can be the same mask. When the mask is shared between the step shown in FIG. 2B and the step shown in FIG. 2C, it is preferable to successively practice the step shown in FIG. 2B and the step shown in FIG. 2C. That is, it is preferable to practice the step shown in FIG. 2C next to the step shown in FIG. 2B, or practice the step shown in FIG. 2B next to the step shown in FIG. 2C.

The step shown in FIG. 2B is practiced to reduce a difference, which can be generated by practicing the step shown in FIG. 2C, between the net quantity of doping impurities of the first conductivity type in the first region 201, and the net quantity of doping the impurities of the first conductivity type in the second region 202. This reduces the difference between the saturated charge quantities of the charge accumulation portion 115a of the G pixel and the charge accumulation portion 115c of the R pixel, and the saturated charge quantity of the charge accumulation portion 115b of the B pixel.

Figure 3C:
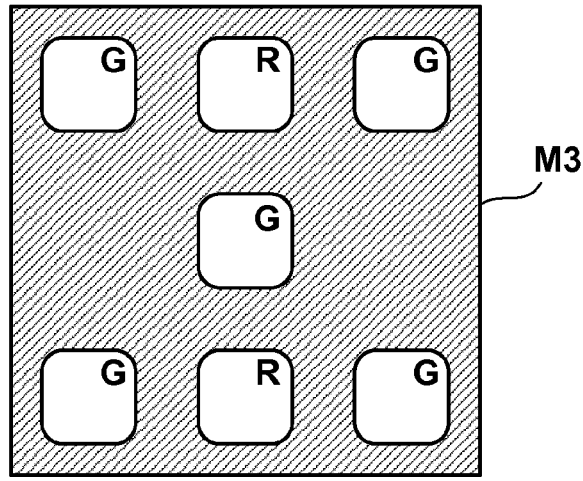

The step (to be referred to as a charge accumulation portion forming step hereinafter) of forming the charge accumulation portion 115a of the G pixel, the charge accumulation portion 115c of the R pixel, and the second charge accumulation portion 115b of the B pixel may be changed as follows. More specifically, the charge accumulation portion forming step may be implemented by a step of forming the charge accumulation portions of the G and R pixels serving as the first pixels P1, and a step of forming the charge accumulation portion of the B pixel serving as the second pixel P2. In the step of forming the charge accumulation portions of the G and R pixels serving as the first pixels P1, a mask M3 shown in FIG. 3C is formed, and impurities of the first conductivity type are doped in the G and R pixels serving as the first pixels P1 through the openings of the mask M3. In the step of forming the charge accumulation portion of the B pixel serving as the second pixel P2, the mask M2 shown in FIG. 3B is formed, and impurities of the first conductivity type are doped in the B pixel serving as the second pixel P2 through the opening of the mask M2. In this modification, the quantity of impurities of the first conductivity type doped in the second region of the second pixel P2 is larger than that of impurities of the first conductivity type doped in the first region of the first pixel P1. This reduces a difference between the net quantity of doping impurities of the first conductivity type in the first region 201, and the net quantity of doping impurities of the first conductivity type in the second region 202.

Figure 4A:
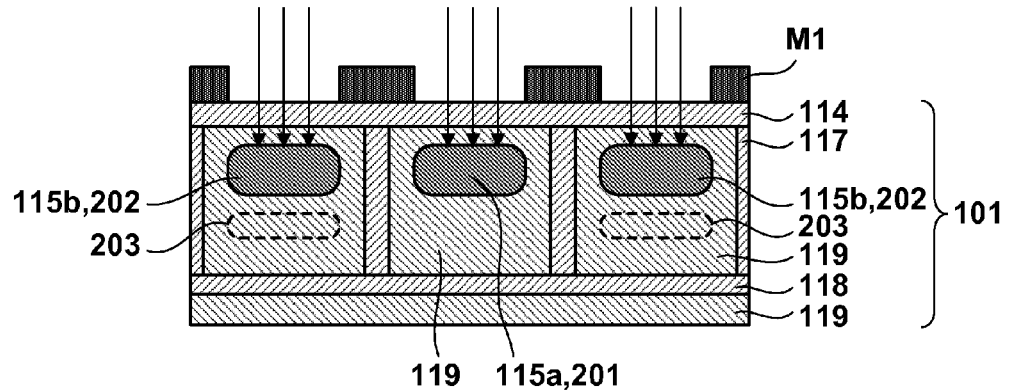
FIGS. 4A to 4C are sectional views showing another example of the method for manufacturing the solid-state image sensor according to the first embodiment.
Figure 4B:
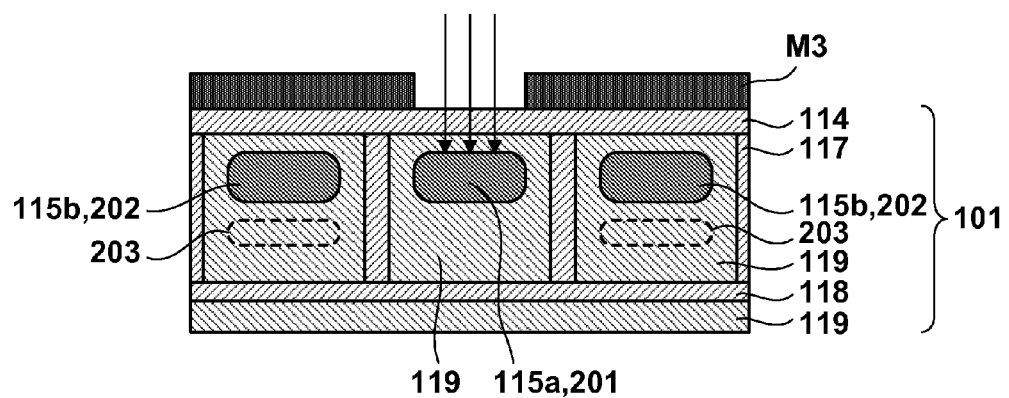
Figure 4C:
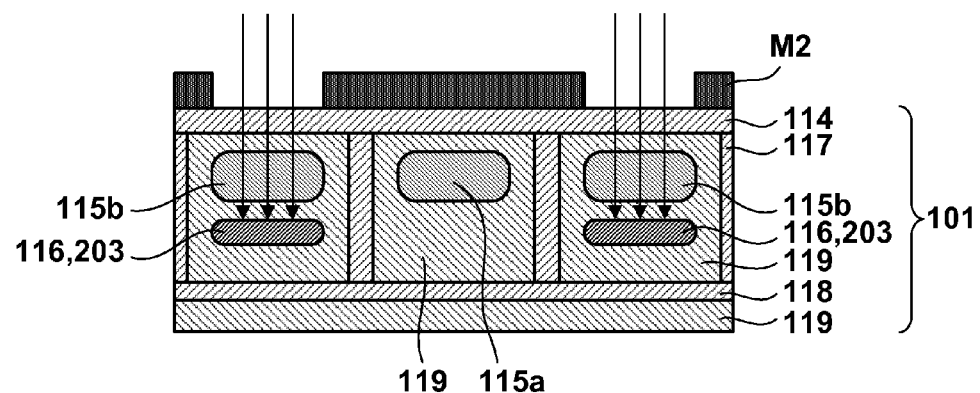

FIGS. 4A to 4C show another example of the method for manufacturing the solid-state image sensor according to the first embodiment of the present invention. Steps shown in FIGS. 4A to 4C can be practiced in an arbitrary order. The steps shown in FIGS. 4A and 4B are steps of forming the charge accumulation portion 115a of a G pixel, the charge accumulation portion 115c of an R pixel, and the second charge accumulation portion 115b of a B pixel. The step shown in FIG. 4A is the same as that shown in FIG. 2A.

In the step shown in FIG. 4B, impurities of the second conductivity type are doped in the first regions 201 of the G and R pixels serving as pixels other than the B pixel in which impurities of the second conductivity type are doped in the third region 203 in the step shown in FIG. 4C. More specifically, a mask M3 is formed on the semiconductor substrate 101, and impurities of the second conductivity type are doped in the first regions 201 of the G and R pixels through the openings of the mask M3. FIG. 3C is a plan view showing the mask M3. The mask M3 can be formed by photolithography.

The step shown in FIG. 4C is the same as that shown in FIG. 2C, and is a step of forming the semiconductor region 116. In the step shown in FIG. 4C, a mask M2 is formed on the semiconductor substrate 101, and impurities of the second conductivity type are doped in the third region 203 of the B pixel through the opening of the mask M2, thereby forming the semiconductor region 116.

The step shown in FIG. 4B is practiced to reduce a difference, which can be generated by practicing the step shown in FIG. 4C, between the net quantity of doping impurities of the first conductivity type in the first region 201, and the net quantity of doping the impurities of the first conductivity type in the second region 202. This reduces the difference between the saturated charge quantities of the charge accumulation portion 115a of the G pixel and the charge accumulation portion 115c of the R pixel, and the saturated charge quantity of the charge accumulation portion 115b of the B pixel.

Figure 5A:
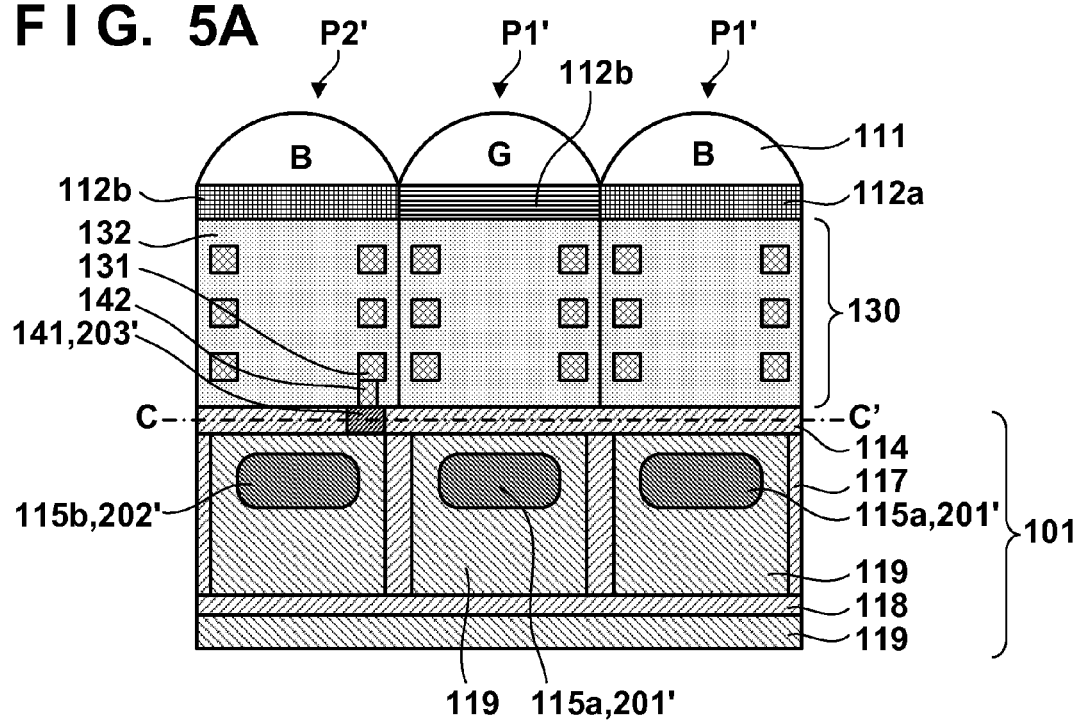
FIGS. 5A and 5B are views showing the arrangement of a solid-state image sensor according to the second embodiment.
Figure 5B:
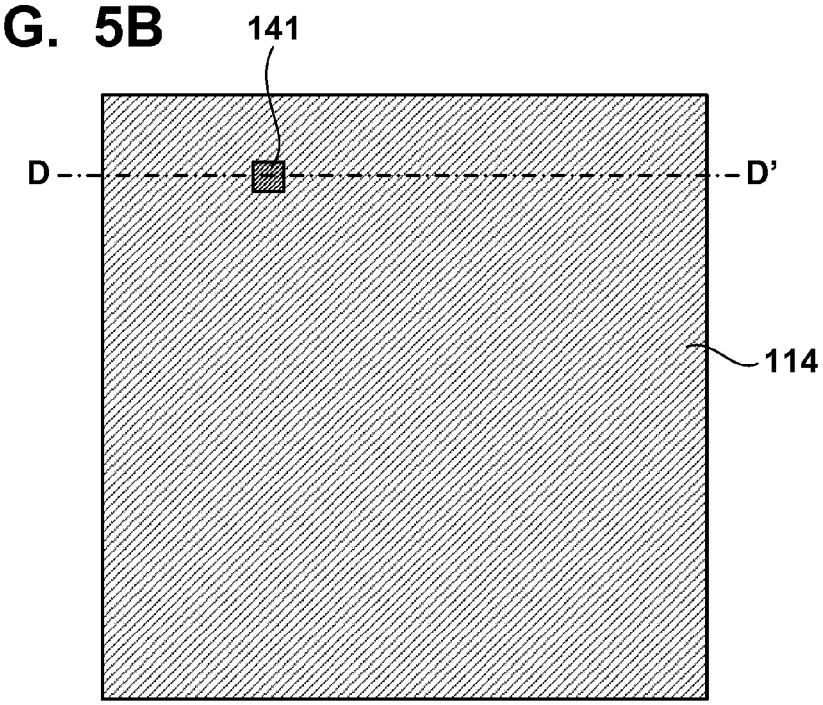

FIGS. 5A and 5B show a solid-state image sensor according to the second embodiment of the present invention. FIG. 5A is a sectional view showing part of the pixel array of the solid-state image sensor taken along a plane perpendicular to the image sensing surface. FIG. 5B is a sectional view showing part of the pixel array of the solid-state image sensor taken along a plane parallel to the image sensing surface. FIG. 5A is a sectional view taken along a line D-D' in FIG. 5B. FIG. 5B is a sectional view taken along a line C-C' in FIG. 5A. Note that matters not mentioned below in the solid-state image sensor according to the second embodiment can comply with those in the first embodiment.

The first embodiment reduces a difference in saturated charge quantity between pixels of a plurality of colors that is generated by forming, in a pixel of a specific color out of the pixels of the plurality of colors, the semiconductor region 116 of a conductivity type different from the conductivity type of the charge accumulation portion. The second embodiment reduces a difference in saturated charge quantity between pixels that is generated by arranging, in some of a plurality of pixels, a semiconductor region in which a contact plug for fixing the potential of a well (semiconductor region in which a photoelectric converter is formed) is connected. Some pixels may be all or some of pixels of a specific color, or may be selected regardless of the color.

In the second embodiment, a pixel in which a contact plug for fixing the potential of a well (semiconductor region in which a photoelectric converter is formed) is not connected will be called a first pixel P1'. A pixel in which a contact plug 142 for fixing the potential of a well (semiconductor region in which a photoelectric converter is formed) is connected will be called a second pixel P2'. The second pixel P2' includes, for example, in a third region 203' of a surface region 114 of the second conductivity type, a semiconductor region 141 of the second conductivity type for ohmic contact with the contact plug 142. The quantity of doping impurities of the second conductivity type in the semiconductor region 141 is larger than the quantity of doping the impurities of the second conductivity type in the surface region 114. The semiconductor region 141 has a surface exposed on the surface of a semiconductor substrate 101 for connection with the contact plug 142. Note that the exposed surface need not belong to the same plane as that of the remaining portions on the surface of the semiconductor substrate 101.

When impurities of the second conductivity type are doped in the third region 203' of the second pixel P2' in order to form the semiconductor region 141 of the second conductivity type, they are also doped in a second region 202' of the second pixel P2'. A difference is thus generated between the quantity of doping the impurities of the second conductivity type in a first region 201' of the first pixel P1', and the quantity of doping the impurities of the second conductivity type in the second region 202' of the second pixel P2'. For example, the impurities of the second conductivity type are not doped in the first region 201' of the first pixel P1', and are doped in the second region 202' of the second pixel P2'. As a result, a difference is generated between the quantity of doping the impurities of the second conductivity type in the first region 201', and the quantity of doping the impurities of the second conductivity type in the second region 202'. Alternatively, the impurities of the second conductivity type of the first quantity are doped in the first region 201' of the first pixel P1', and the impurities of the second conductivity type of the second quantity larger than the first quantity are doped in the second region 202' of the second pixel P2'. As a consequence, a difference is generated between the quantity of doping the impurities of the second conductivity type in the first region 201', and the quantity of doping the impurities of the second conductivity type in the second region 202'. If charge accumulation portions 115a and 115b are formed under the same conditions without considering this difference, a difference can be generated between the net quantity of doping impurities of the first conductivity type in the first region 201' of the first pixel P1', and the net quantity of doping the impurities of the first conductivity type in the second region 202' of the second pixel P2'. Accordingly, a difference is generated between the saturated charge quantity of the charge accumulation portion 115a of the first pixel P1' and the saturated charge quantity of the charge accumulation portion 115b of the second pixel P2'. This degrades the image quality. Thus, impurities are doped in the first region 201' and second region 202' to reduce the difference between the net quantity of doping impurities of the first conductivity type in the first region 201' of the first pixel P1', and the net quantity of doping impurities of the first conductivity type in the second region 202' of the second pixel P2'.

Figure 6A:
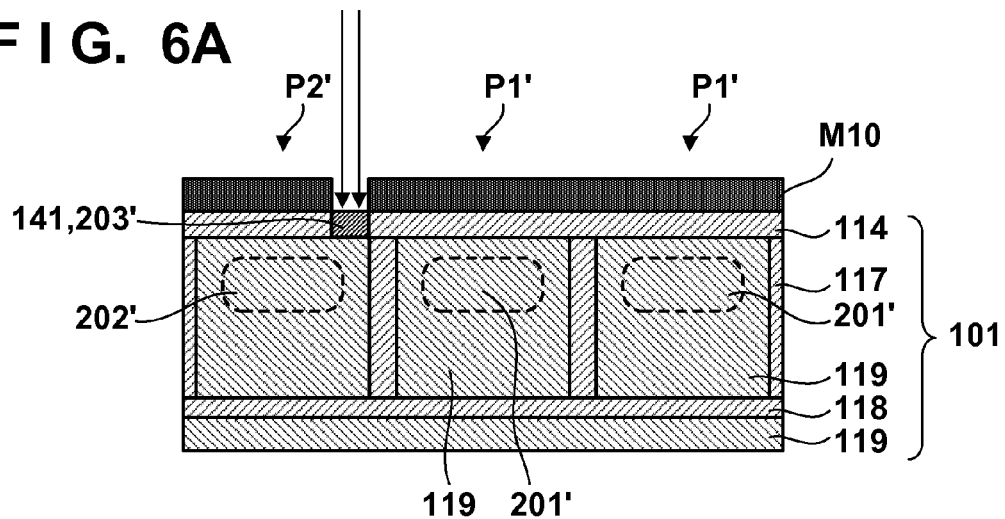
FIGS. 6A to 6C are sectional views showing an example of a method for manufacturing the solid-state image sensor according to the second embodiment.
Figure 6B:
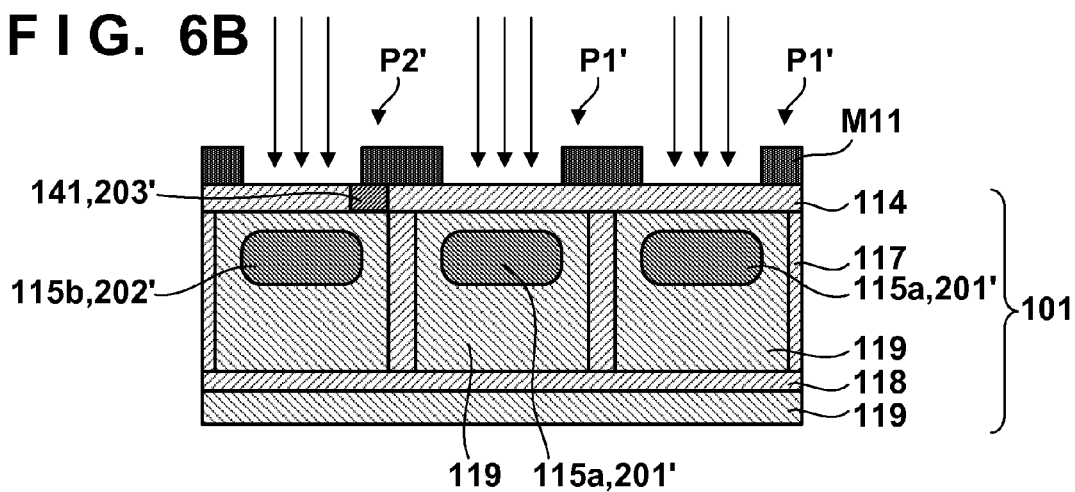
Figure 6C:
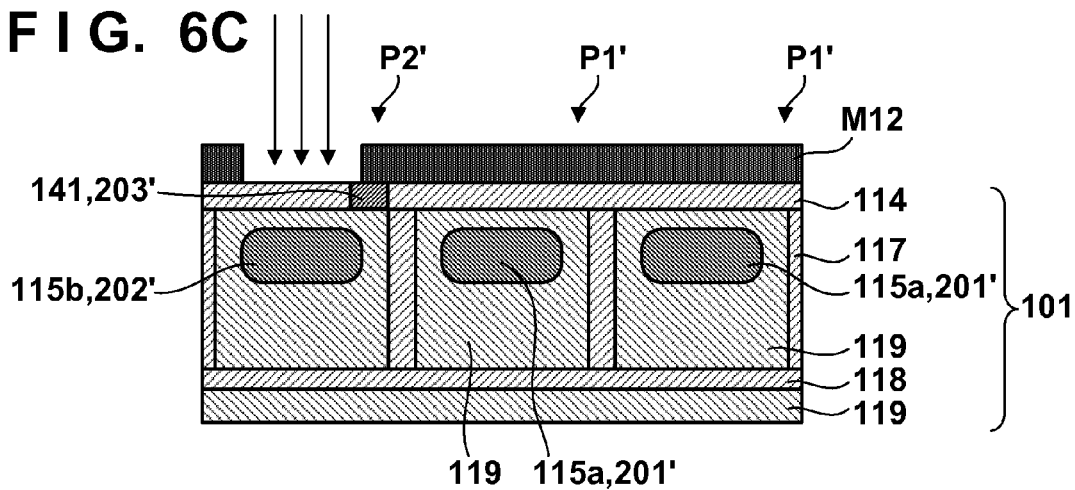

FIGS. 6A to 6C show an example of a method for manufacturing the solid-state image sensor according to the second embodiment of the present invention. Steps shown in FIGS. 6A to 6C can be practiced in an arbitrary order. The step shown in FIG. 6A is a step of forming the semiconductor region 141. In the step shown in FIG. 6A, a mask M10 is formed on a semiconductor substrate 101, and impurities of the second conductivity type are doped in a third region 203' of a second pixel P2' through the opening of the mask M10, thereby forming a semiconductor region 141 for ohmic contact with a contact plug 142.

Figure 7A:
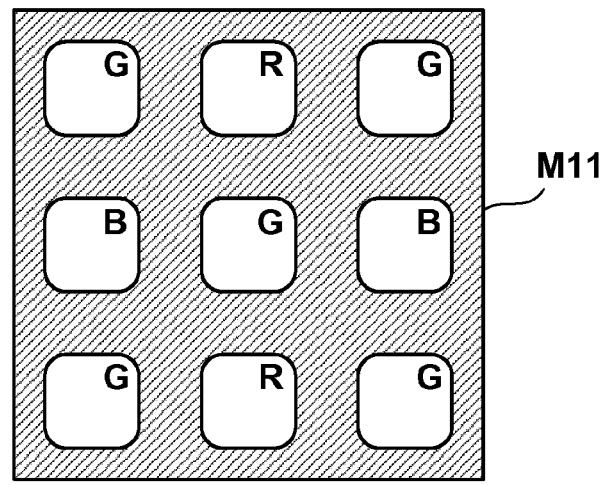
FIGS. 7A to 7C are plan views showing a mask formed in the manufacture of the solid-state image sensor according to the second embodiment.

The steps shown in FIGS. 6B and 6C are steps of forming the first charge accumulation portion 115a of a first pixel P1' and the second charge accumulation portion 115b of the second pixel P2'. In the step shown in FIG. 6B, a mask M11 is formed on a semiconductor substrate 101, and impurities of the first conductivity type are doped simultaneously in a first region 201' of the first pixel P1' and a second region 202' of the second pixel P2' through the openings of the mask M11, thereby forming a first charge accumulation portion 115a and second charge accumulation portion 115b. FIG. 7A is a plan view showing the mask M11. The mask M11 can be formed by photolithography.

Figure 7B:
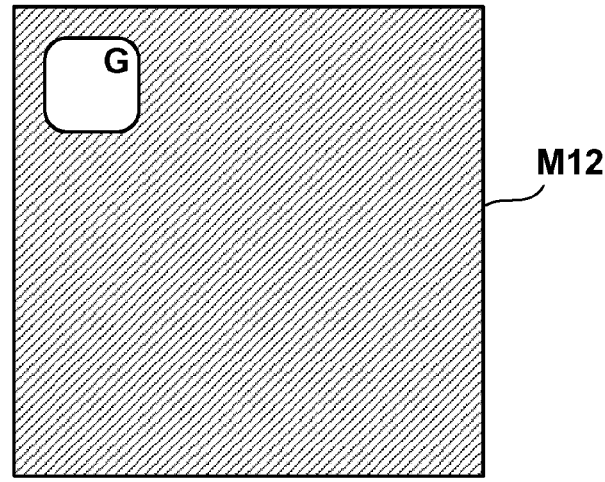

In the step shown in FIG. 6C, impurities of the first conductivity type are doped in the second region 202' of the second pixel P2' in which the impurities of the second conductivity type have been doped in the third region 203' in the step shown in FIG. 6A. More specifically, a mask M12 is formed on the semiconductor substrate 101, and impurities of the first conductivity type are doped in the second region 202' of the second pixel P2' through the opening of the mask M12. The mask M12 is arranged so that, in this step, the impurities of the first conductivity type are not doped in the first region 201' of the first pixel P1'. FIG. 7B is a plan view showing the mask M12. The mask M12 can be formed by photolithography.

The step shown in FIG. 6C can be practiced to reduce a difference, which can be generated by practicing the step shown in FIG. 6A, between the net quantity of doping impurities of the first conductivity type in the first region 201', and the net quantity of doping the impurities of the first conductivity type in the second region 202'. This reduces the difference between the saturated charge quantities of the first charge accumulation portion 115a of the first pixel P1' and the second charge accumulation portion 115b of the second pixel P2'.

Figure 7C:
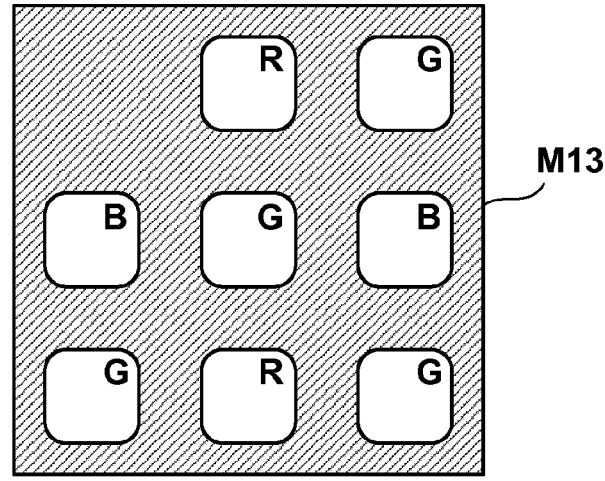

The step (to be referred to as a charge accumulation portion forming step hereinafter) of forming the first charge accumulation portion 115a of the first pixel P1' and the second charge accumulation portion 115b of the second pixel P2' may be changed as follows. More specifically, the charge accumulation portion forming step may be implemented by a step of forming the first charge accumulation portion 115a of the first pixel P1', and a step of forming the second charge accumulation portion 115b of the second pixel P2'. In the step of forming the first charge accumulation portion 115a of the first pixel P1', a mask M13 shown in FIG. 7C is formed, and impurities of the first conductivity type are doped in the first region 201' of the first pixel P1' through the opening of the mask M13. In the step of forming the second charge accumulation portion 115b of the second pixel P2', a mask M12 shown in FIG. 7B is formed, and impurities of the first conductivity type are doped in the second region 202' of the second pixel P2' through the opening of the mask M12. In this modification, the quantity of impurities of the first conductivity type doped in the second region of the second pixel P2' is larger than that of impurities of the first conductivity type doped in the first region of the first pixel P1'. This reduces a difference between the net quantity of doping impurities of the first conductivity type in the first region 201', and the net quantity of doping impurities of the first conductivity type in the second region 202'.

Figure 8A:
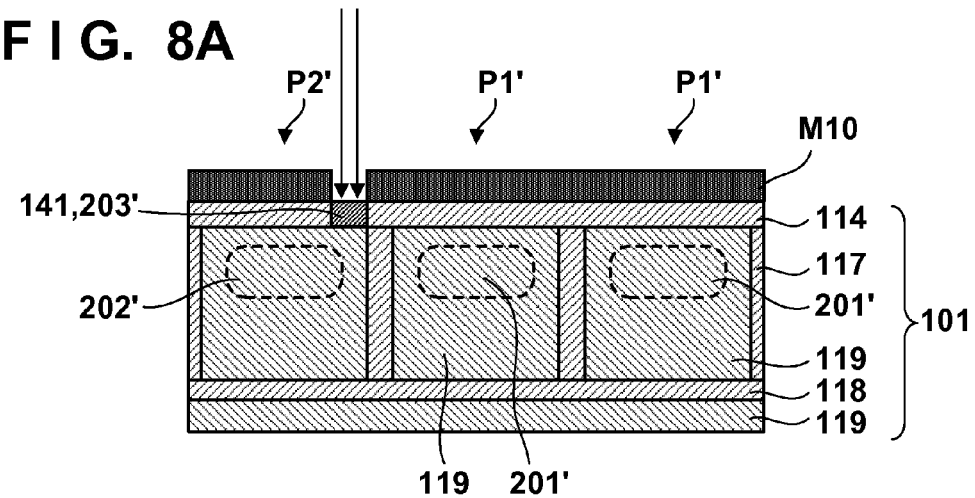
FIGS. 8A to 8C are sectional views showing another example of the method for manufacturing the solid-state image sensor according to the second embodiment.
Figure 8B:
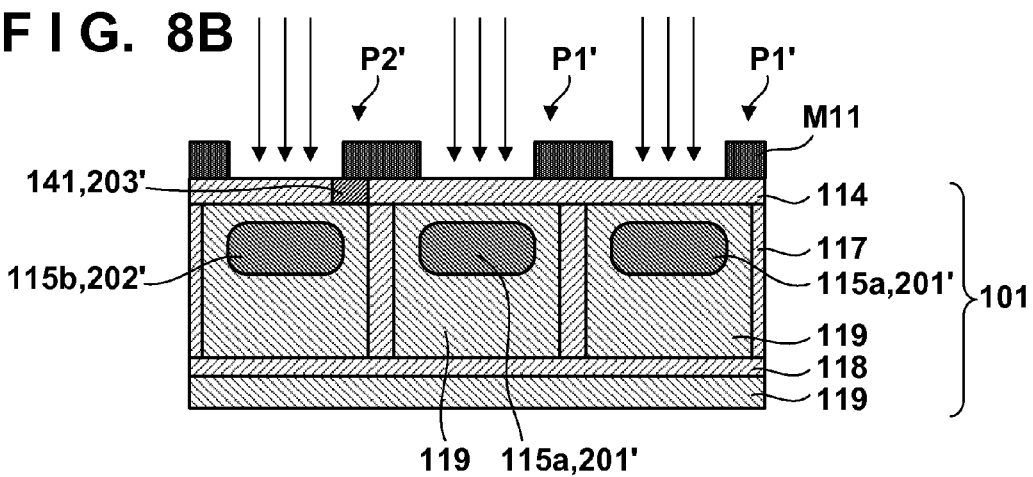
Figure 8C:
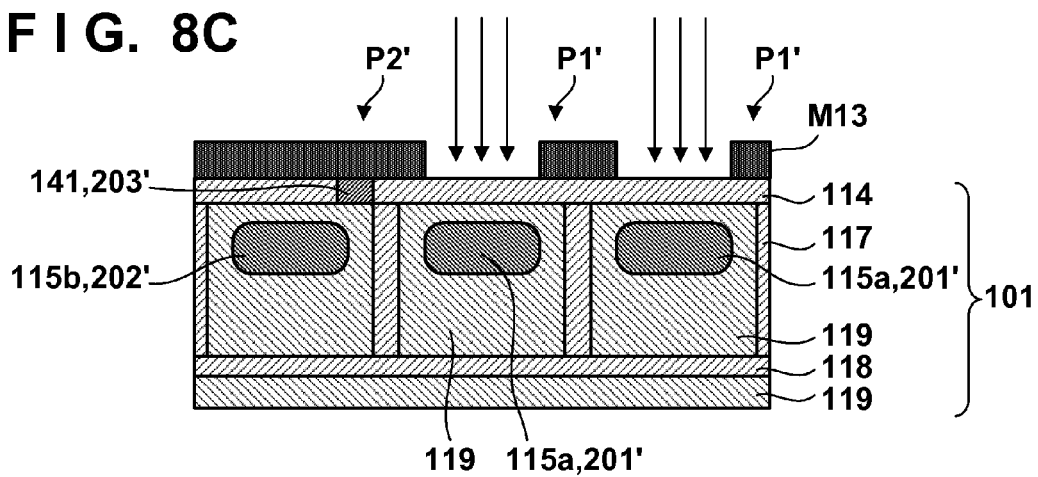

FIGS. 8A to 8C show another example of the method for manufacturing the solid-state image sensor according to the second embodiment of the present invention. Steps shown in FIGS. 8A to 8C can be practiced in an arbitrary order. The step shown in FIG. 8A is the same as that shown in FIG. 6A, and is a step of forming the semiconductor region 141 for ohmic contact with the contact plug 142. In the step shown in FIG. 8A, a mask M10 is formed on the semiconductor substrate 101, and impurities of the second conductivity type are doped in the third region 203' of the second pixel P2' through the opening of the mask M10, thereby forming the semiconductor region 141.

The steps shown in FIGS. 8B and 8C are steps of forming the first charge accumulation portion 115a of the first pixel P1' and the second charge accumulation portion 115b of the second pixel P2'. The step shown in FIG. 8B is the same as that shown in FIG. 6B.

In the step shown in FIG. 8C, impurities of the second conductivity type are doped in the first region 201' of the first pixel P1' serving as a pixel other than the second pixel P2' in which impurities of the second conductivity type are doped in the third region 203' in the step shown in FIG. 8A. More specifically, a mask M13 is formed on the semiconductor substrate 101, and impurities of the second conductivity type are doped in the first region 201' of the first pixel P1' through the opening of the mask M13. FIG. 7C is a plan view showing the mask M13. The mask M13 can be formed by photolithography.

The step shown in FIG. 8C can be practiced to reduce a difference, which can be generated by practicing the step shown in FIG. 8A, between the net quantity of doping impurities of the first conductivity type in the first region 201', and the net quantity of doping the impurities of the first conductivity type in the second region 202'. This reduces the difference between the saturated charge quantities of the charge accumulation portion 115a of the first pixel P1' and the charge accumulation portion 115b of the second pixel P2'.

The third embodiment of the present invention will be described. The structure of a solid-state image sensor according to the third embodiment is the same as that in the first embodiment. That is, FIGS. 1A and 1B show the structure of the solid-state image sensor according to the third embodiment. Note that matters not mentioned below in the solid-state image sensor according to the third embodiment can comply with those in the first embodiment.

In the solid-state image sensor according to the third embodiment, a buried layer 118 of the second conductivity type is formed at a position deeper than a first region 201 of a first pixel P1 and a second region 202 of a second pixel P2. A semiconductor region 116 of the second conductivity type is formed between the second region 202 of the second pixel P2 and the buried layer 118. In a manufacturing method according to the third embodiment, in a step of doping impurities of the second conductivity type to form the semiconductor region 116 of the second conductivity type, the impurities of the second conductivity type are doped neither in the first region 201 of a first pixel P1 nor the second region 202 of the second pixel P2. In the charge accumulation portion forming step, the net quantity of doping impurities of the first conductivity type in the second region of the second pixel P2 is larger than the net quantity of doping the impurities of the first conductivity type in the first region of the first pixel P1.

In this arrangement, the volume of a continuous semiconductor region of the first conductivity type including a charge accumulation portion 115b in the second pixel P2 is smaller than that of a continuous semiconductor region of the first conductivity type including a charge accumulation portion 115a in the first pixel P1. In contrast, the net quantity of doping impurities of the first conductivity type in the charge accumulation portion 115b (second region 202) of the second pixel P2 is larger than the net quantity of doping the impurities of the first conductivity type in the charge accumulation portion 115a (first region 201) of the first pixel P1. This can reduce the difference between the saturated charge quantity of the charge accumulation portion 115a of the G pixel and the saturated charge quantity of the charge accumulation portion 115b of the B pixel.

Note that the G pixel has been exemplified as the first pixel, and the B pixel has been exemplified as the second pixel. However, the present invention is not limited to this example. The first pixel is a pixel configured to receive a light in the first wavelength range, and the second pixel is a pixel configured to receive a light in the second wavelength range in which the central wavelength is shorter than that in the first wavelength range.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-182474, filed Sep. 3, 2013, which is hereby incorporated by reference herein in its entirety.

What is claimed is:

1. A method for manufacturing a solid-state image sensor including a first pixel and a second pixel in a semiconductor substrate,
the first pixel including a first charge accumulation portion of a first conductivity type in a first region of the semiconductor substrate, and
the second pixel including a second charge accumulation portion of the first conductivity type in a second region of the semiconductor substrate, and a semiconductor region of a second conductivity type in a third region of the semiconductor substrate, the second conductivity type being different from the first conductivity type,
the method comprising the steps of:
forming the first charge accumulation portion and the second charge accumulation portion; and
forming the semiconductor region,
wherein in the step of forming the semiconductor region, impurities of the second conductivity type are doped in the third region, and the impurities of the second conductivity type are doped in at least the second region such that a first difference is generated between a quantity of doping the impurities of the second conductivity type in the first region, and a quantity of doping the impurities of the second conductivity type in the second region, and
in the step of forming the first charge accumulation portion and the second charge accumulation portion, impurities are doped in the first region and the second region to reduce a second difference between a net quantity of doping impurities of the first conductivity type in the first region, and a net quantity of doping impurities of the first conductivity type in the second region.

2. The method according to claim 1, further comprising the step of forming a buried layer of the second conductivity type of the semiconductor substrate at a position deeper than the first charge accumulation portion and the second charge accumulation portion,
wherein the first pixel is a pixel configured to receive a light in a first wavelength range, and the second pixel is a pixel configured to receive a light in a second wavelength range, a central wavelength in the second wavelength range being shorter than a central wavelength in the first wavelength range, and
the third region is positioned between the second region and the buried layer.

3. The method according to claim 2, wherein the step of forming the first charge accumulation portion and the second charge accumulation portion includes the steps of:
doping the impurities of the first conductivity type simultaneously in the first region and the second region; and
doping the impurities of the second conductivity type in the first region out of the first region and the second region.

4. The method according to claim 2, wherein the step of forming the first charge accumulation portion and the second charge accumulation portion includes the steps of:
doping the impurities of the first conductivity type simultaneously in the first region and the second region; and
doping the impurities of the first conductivity type in the second region out of the first region and the second region.

5. The method according to claim 3, wherein a mask is commonly used in the step of forming the semiconductor region, and the step of doping the impurities of the first conductivity type in the second region out of the first region and the second region.

6. The method according to claim 2, wherein the step of forming the first charge accumulation portion and the second charge accumulation portion includes the steps of:
doping the impurities of the first conductivity type in the first region out of the first region and the second region; and
doping the impurities of the first conductivity type in the second region out of the first region and the second region.

7. The method according to claim 1, wherein the semiconductor region includes a surface exposed on a surface of the semiconductor substrate, and a contact plug is connected to the exposed surface.

8. The method according to claim 7, wherein the step of forming the first charge accumulation portion and the second charge accumulation portion includes the steps of:
doping the impurities of the first conductivity type simultaneously in the first region and the second region; and
doping the impurities of the first conductivity type in the second region out of the first region and the second region.

9. The method according to claim 7, wherein the step of forming the first charge accumulation portion and the second charge accumulation portion includes the steps of:
doping the impurities of the first conductivity type in the first region out of the first region and the second region; and
doping the impurities of the first conductivity type in the second region out of the first region and the second region.

10. The method according to claim 7, wherein the step of forming the first charge accumulation portion and the second charge accumulation portion includes the steps of:
doping the impurities of the first conductivity type simultaneously in the first region and the second region; and
doping the impurities of the second conductivity type in the first region out of the first region and the second region.

11. The method according to claim 1, wherein both of the impurities of the first conductivity type and the impurities of the second conductivity type are doped into at least one of the first region and the second region through the step of forming the first charge accumulation portion and the second charge accumulation portion and the step of forming the semiconductor region.

12. The method according to claim 1, wherein the step of forming the semiconductor region includes forming a mask covering the first region and having an opening corresponding to the third region.

13. The method according to claim 1, wherein the step of forming the first charge accumulation portion and the second charge accumulation portion includes forming a mask covering one of the first region and the second region and having an opening corresponding to another one of the first region and the second region.

14. The method according to claim 1, wherein the solid-state image sensor includes a surface region of the second conductivity type on the first accumulation region and the second accumulation regions, and wherein the method further comprises a step of forming the surface region.

15. A method for manufacturing a solid-state image sensor including, in a semiconductor substrate, a first pixel configured to receive a light in a first wavelength range, and a second pixel configured to receive a light in a second wavelength range, a central wavelength in the second wavelength range being shorter than a central wavelength in the first wavelength range,
- the first pixel including a first charge accumulation portion of a first conductivity type in a first region of the semiconductor substrate,
- the second pixel including a second charge accumulation portion of the first conductivity type in a second region of the semiconductor substrate, and a semiconductor region of a second conductivity type in a third region of the semiconductor substrate, the second conductivity type being different from the first conductivity type,
- the manufacturing method comprising the steps of:
- forming the first charge accumulation portion and the second charge accumulation portion;
- forming a buried layer of the second conductivity type of the semiconductor substrate at a position deeper than the first charge accumulation portion and the second charge accumulation portion; and
- forming the semiconductor region of the semiconductor substrate between the second region and the buried layer,
- wherein in the step of forming the first charge accumulation portion and the second charge accumulation portion, impurities are doped in the first region and the second region to make a net quantity of doping impurities of the first conductivity type in the second region be larger than a net quantity of doping impurities of the first conductivity type in the first region,
- wherein in the step of forming the semiconductor region, impurities of the second conductivity type are doped in the third region, and the impurities of the second conductivity type to reduce a difference between a net quantity of doping impurities of the first conductivity type in the first region and a net quantity of doping impurities of the first conductivity type in the second region.

16. The method according to claim 15, wherein both of the impurities of the first conductivity type and the impurities of the second conductivity type are doped into at least one of the first region and the second region through the step of forming the first charge accumulation portion and the second charge accumulation portion and the step of forming the semiconductor region.

17. The method according to claim 15, wherein the step of forming the semiconductor region includes forming a mask covering the first region and having an opening corresponding to the third region.

18. The method according to claim 15, wherein the step of forming the first charge accumulation portion and the second charge accumulation portion includes forming a mask covering one of the first region and the second region and having an opening corresponding to another one of the first region and the second region.

19. The method according to claim 15, wherein the solid-state image sensor includes a surface region of the second conductivity type on the first accumulation region and the second accumulation regions, and wherein the method further comprises a step of forming the surface region.

* * * * *